(12) United States Patent
Ortiz Rojo et al.

(10) Patent No.: US 12,117,660 B2
(45) Date of Patent: Oct. 15, 2024

(54) FIBER OPTIC CONNECTOR

(71) Applicant: KNOWLEDGE DEVELOPMENT FOR POF, S.L., Madrid (ES)

(72) Inventors: David Ortiz Rojo, Madrid (ES); Plinio Jesus Pinzon Castillo, Madrid (ES); Ruben Perez-Aranda, Madrid (ES); Carlos Pardo Vidal, Madrid (ES); Markus Dittmann, Madrid (DE)

(73) Assignee: KNOWLEDGE DEVELOPMENT FOR POF, S.L., Madrid (ES)

( * ) Notice: Subject to any disclaimer, the term of this patent is extended or adjusted under 35 U.S.C. 154(b) by 72 days.

(21) Appl. No.: 17/757,691

(22) PCT Filed: Dec. 8, 2020

(86) PCT No.: PCT/EP2020/084979
§ 371 (c)(1),
(2) Date: Jun. 17, 2022

(87) PCT Pub. No.: WO2021/122127
PCT Pub. Date: Jun. 24, 2021

(65) Prior Publication Data
US 2023/0023827 A1 Jan. 26, 2023

(30) Foreign Application Priority Data
Dec. 20, 2019 (EP) .................................... 19383168

(51) Int. Cl.
*H04B 10/00* (2013.01)
*G02B 6/42* (2006.01)

(52) U.S. Cl.
CPC ......... *G02B 6/4238* (2013.01); *G02B 6/4214* (2013.01); *G02B 6/4232* (2013.01); *G02B 6/426* (2013.01)

(58) Field of Classification Search
CPC .. G02B 6/4238; G02B 6/4214; G02B 6/4232; G02B 6/426; G02B 6/3897;
(Continued)

(56) References Cited

U.S. PATENT DOCUMENTS 6,229,712 B1 5/2001 Munoz-Bustamante et al.
6,477,286 B1 * 11/2002 Ouchi ...................... G02B 6/10
257/433

(Continued)

FOREIGN PATENT DOCUMENTS

EP 1602955 A2 12/2005
EP 2428828 A1 3/2012
(Continued)

OTHER PUBLICATIONS

ISA European Patent Office, International Search Report Issued in Application No. PCT/EP2020/084979, Mar. 3, 2021, WIPO, 2 pages.
(Continued)

*Primary Examiner* — Agustin Bello
(74) *Attorney, Agent, or Firm* — McCoy Russell LLP

(57) ABSTRACT

A casing for housing a fiber optic transceiver for use in a fiber optic connector can include a top surface, a bottom surface and one or more lateral surfaces, wherein the top surface and at least one or more lateral surfaces are at least in parts electrically conductive, and wherein the bottom surface of the casing comprises one or more solder pads.

20 Claims, 3 Drawing Sheets

(58) Field of Classification Search
CPC ......... G02B 6/4246; H05K 2201/0707; H05K 2201/09354; H05K 2201/09618; H05K 2201/09809; H05K 1/0219; H05K 1/0274; H05K 2201/10121; H05K 2201/2054

See application file for complete search history.

(56) References Cited

U.S. PATENT DOCUMENTS

| | | | |
|---|---|---|---|
| 6,945,712 B1 | 9/2005 | Conn | |
| 7,484,897 B2* | 2/2009 | Ono | G02B 6/4231 385/91 |
| 7,872,346 B1* | 1/2011 | Chee | H01L 23/60 257/E23.079 |
| 10,162,139 B1* | 12/2018 | Wang | G02B 6/122 |
| 10,578,799 B2* | 3/2020 | Doerr | G02B 6/4269 |
| 10,606,003 B2* | 3/2020 | Peterson | G02B 6/4246 |
| 11,899,251 B2* | 2/2024 | Zhang | G02B 6/42 |
| 2002/0145185 A1* | 10/2002 | Shrauger | H01L 23/15 257/E23.009 |
| 2006/0072882 A1* | 4/2006 | Casati | G02B 6/4277 385/94 |
| 2008/0063342 A1* | 3/2008 | Ono | G02B 6/4292 385/88 |
| 2009/0114914 A1* | 5/2009 | Lin | H01L 25/50 257/737 |
| 2009/0226130 A1* | 9/2009 | Doany | G02B 6/4246 385/14 |
| 2010/0006784 A1* | 1/2010 | Mack | G02B 6/43 250/551 |
| 2013/0272649 A1* | 10/2013 | Braunisch | G02B 6/4261 29/831 |
| 2013/0330082 A1 | 12/2013 | Perez De Aranda Alonso et al. | |
| 2015/0241631 A1* | 8/2015 | Fish | G02B 6/12004 385/14 |
| 2016/0116695 A1* | 4/2016 | Nekado | G02B 6/4249 385/14 |
| 2018/0031786 A1* | 2/2018 | Aoki | G02B 6/4256 |
| 2018/0203187 A1* | 7/2018 | Doerr | G02B 6/428 |
| 2019/0250327 A1* | 8/2019 | Huang | G02B 6/12002 |
| 2021/0132309 A1* | 5/2021 | Zhang | H05K 1/186 |
| 2022/0158736 A1* | 5/2022 | Testa | G02B 6/4245 |
| 2022/0303436 A1* | 9/2022 | Luan | H05K 3/303 |
| 2023/0023827 A1* | 1/2023 | Ortiz Rojo | H05K 1/0219 |

FOREIGN PATENT DOCUMENTS

| | | |
|---|---|---|
| JP | 2007127796 A | 5/2007 |
| JP | 2007324303 A | 12/2007 |
| JP | 2008040318 A | 2/2008 |
| JP | 2010002579 A | 1/2010 |
| JP | 2015222803 A | 12/2015 |
| WO | 2010113910 A1 | 10/2010 |

OTHER PUBLICATIONS

Japanese Patent Office, Office Action Issued in Application No. 2022-537621, Aug. 22, 2023, 15 pages. (Submitted with Machine Translation).

* cited by examiner

FIBER OPTIC CONNECTOR

CROSS REFERENCE TO RELATED APPLICATIONS

The present application is a U.S. National Phase of International Application No. PCT/EP2020/084979 entitled "FIBER OPTIC CONNECTOR," and filed on Dec. 8, 2020. International Application No. PCT/EP2020/084979 claims priority to European Patent Application No. 19383168.2 filed on Dec. 20, 2019. The entire contents of each of the above-listed applications are hereby incorporated by reference for all purposes.

TECHNICAL FIELD

The-disclosure relates to a casing or packaging for housing a fiber optic transceiver for use in a fiber optic connector, a fiber optic transceiver, an assembly comprising a fiber optic connector and a fiber optic transceiver and a method for assembling a surface mounted fiber optic connector.

BACKGROUND AND SUMMARY

Optical communication systems are nowadays widely used in home networks and industrial applications, for example, the MOST (Media Oriented Systems Transport) technology used in the automotive industry for high-speed multimedia networks is based on plastic optical fiber (POF) technology.

For example, in the optical communication system described in US 2013/0330082 A1, a light emitting device, the optical transmitter, outputs an optical signal that is fed into an optical fiber link, e.g. a plastic fiber, which guides the optical signal to a light receiving device, the optical receiver, which comprises a photo detector for receiving the optical signal.

Such optical communication systems inter alia have several advantages compared with the conventional non-optical communication systems over copper: e.g. lower attenuation, immunity to electromagnetic interference irradiation and higher data rate transmission. In recent years optical communication systems are therefore more and more also used for in-vehicle data communication.

Fiber optic transceivers (FOTs) and fiber optic connectors (FOCs) comprising FOTs are one of the key components of an optical communication system in which they can, for example, serve as unidirectional or bidirectional communication links.

However, fiber optic transceivers and fiber optic connectors are rather complex components since they are typically composed of a plurality of elements of different nature, comprising inter alia various electronic components and electronic circuits, photonics components, interconnection elements, optical elements, and electromagnetic shielding components.

Due to the complexity and diversity of fiber optic transceivers current assembly, test and supply chains of FOTs are complex, long, cost and manufacturing resources intensive.

Current fiber optic transceivers designs are not optimized for testing along the supply chain and require complex assembly methods.

Furthermore, current FOT assembly methods and FOT design solutions inter alia restrict the degrees of freedom in material selection for the optical components of the FOT, or restrict the possible technologies used in the electronic components of the FOT.

For example, many materials suitable for use in the optical path do not support reflow soldering of the FOT as applied in current manufacturing and assembly procedures. Thus, fiber optic connectors containing FOTs currently often require special (non-reflow) solder processes or may require that the FOT and the connector are to be made of materials that can withstand the high reflow soldering temperatures.

These restrictions of current manufacturing and assembly procedures for FOTs and FOCs therefore can lead to additional required efforts and costs and moreover can make it more difficult to meet increasing performance requirements and latest quality and safety standards for optical communication systems.

Problem

It is therefore the object of the present-disclosure to provide means for improving an optical communication system. In particular, it is an object of the present-disclosure to provide an improved casing for housing a fiber optic transceiver for use in a fiber optic connector, in particular a surface mounted fiber optic connector, as part of an optical communication system assembly.

It is further an object of the present-disclosure to provide improved means for the assembly of an optical communication system, in particular to provide improved mean for assembling a surface mounted fiber optic connector comprising a fiber optic transceiver.

For example, the object may comprise improving the cost and manufacturing efficiency, as well as the performance and reliability of an optical communication system, in particular, improving the cost and manufacturing efficiency and the performance and reliability of a fiber optic transceiver housed in a casing for use in a fiber optic connector.

Solution

According to the present-disclosure, this object is achieved by a casing or packaging for housing a fiber optic transceiver for use in a fiber optic connector, a fiber optic transceiver, an assembly comprising a fiber optic connector and a fiber optic transceiver and a method for assembling a surface mounted fiber optic connector.

For example, a casing for housing a fiber optic transceiver for use in a fiber optic connector, in particular as part of an optical communication system, may comprise one, some or all of the following elements, features or components:

a top surface, a bottom surface and one or more lateral surfaces, wherein the top surface and at least one or more lateral surfaces can at least in parts be electrically conductive, thereby providing electromagnetic shielding for the fiber optic transceiver and wherein the bottom surface of the casing may comprise one or more solder pads, which can provide electrical connectivity for the fiber optic transceiver and/or that can act as heat sink to transfer heat off the fiber optic transceiver.

The herein exemplarily described casing or packaging for a fiber optic transceiver, may in particular be suited for housing a surface mounted fiber optic transceiver, e.g. a so-called skylooker fiber optic transceiver that can, for example, be mounted on a surface of a printed circuit board, for use in a fiber optic connector and as indicated above may comprise a plurality of faces or sides or surfaces, wherein said faces or sides or surfaces may include at least one top surface or top face or top side, at least one bottom surface or bottom face or bottom side and one or more lateral surfaces or lateral faces or lateral sides.

The one or more solder pads can each provide a non-pointlike two-dimensional extended contact surface as compared to, for example, a pointlike contact provided by a pin.

Stated differently, the one or more solder pads can each comprise a flat, planar contact surface for establishing a contact, in particular an electrical contact and/or thermal coupling, of the casing or packaging for a fiber optic transceiver to an external component such as a printed circuit board.

The herein exemplarily described casing or packaging for a fiber optic transceiver provides, in particular due to the plurality and design of the solder pads, an improved thermal coupling from the integrated circuits (ICs) of the fiber optic transceiver inside the casing to a metal ground layer of a printed circuit board (PCB), last but not least thanks to the increased cross-section surface(s) of the herein described exemplary solder pads as compared to conventional thin lead-frame pins and also due to allowing a shorter distance of the bottom side of the casing or packaging for a fiber optic transceiver to the surface of a printed circuit board. Furthermore, the herein exemplarily described casing or packaging for a fiber optic transceiver also provides an optimal electrical connectivity of the integrated circuits of the fiber optic transceiver to components of the printed circuit board.

At the same time the herein exemplarily described casing or packaging for a fiber optic transceiver provides an optimal electromagnetic shielding of the components of the fiber optic transceiver.

For example, the casing or packing material, in particular the material of the top surface and at least one or more lateral surfaces, e.g. the material of all lateral surfaces, of the casing or packing for a fiber optic transceiver may comprise metal or metallic materials and/or conductive polymer materials.

In other words, the electromagnetic shielding is integrated into the casing of the fiber optic transceiver and no additional extra component or manufacturing step is required to provide electromagnetic shielding for the fiber optic transceiver.

The use of solder pads instead of pins further significantly simplifies the construction of the casing or packaging for a fiber optic transceiver and/or the construction of a fiber connector comprising the casing or packaging and the fiber optic transceiver. The herein exemplarily described pinless casing or packaging for a fiber optic transceiver provides a more robust design that minimizes the risk of the fiber optic transceiver or the fiber connector being damaged during assembly and provides an opportunity to use a larger variety of assembling techniques, including more efficient and faster assembly, that may incur mechanical stress to the casing or packaging for a fiber optic transceiver and that would normally damage common fiber optic transceiver.

The herein exemplarily described casing or packaging for a fiber optic transceiver may in particular comprise one or more solder pads that can be arranged substantially in or around the center the bottom surface of the casing and/or can comprise one or more solder pads that can be arranged substantially along or close to the perimeter of the bottom surface of the casing.

The one or more solder pads that can be arranged substantially in or around the center the bottom surface of the casing can in particular act as a heat sink to provide improved thermal coupling between possible integrated circuits of the fiber optic transceiver inside the casing to a possible metal ground layer of a printed circuit board, while the exemplary one or more solder pads that can be arranged substantially along or close to the perimeter of the bottom surface of the casing may provide/establish electrical connectivity of the integrated circuits of the fiber optic transceiver to components of the printed circuit board.

One, some or all of the possible exemplary solder pads may be arranged substantially in or around the center the bottom surface and can be configured to be connected to ground potential, e.g. a ground potential of a printed circuit board and/or at least one, some or all of the exemplary solder pads that may be arranged substantially along or close to the perimeter of the bottom surface can be configured to provide an electrical connection between components of a fiber optic transceiver housed in the casing and integrated circuit components of a printed circuit board onto which the casing can be mounted.

This way an optimized balance of low thermal resistance, effective and efficient electrical connectivity and electromagnetic shielding of the fiber optic transceiver can be achieved that inter alia leads to improved performance and interconnection of optical communication systems.

In addition, the herein described casing or packaging for a fiber optic transceiver simplified assembling of a surface mounted fiber optic connector, since, for example, the casing can be mounted/soldered onto a printed circuit in a single step.

The arrangement of the possible solder pads arranged substantially along or close to the perimeter or edge of the bottom surface of the casing can be regular, e.g. with a regular pitch for the distance of adjacent pads on a given side or edge of the bottom surface, but other nonregular arrangements of these exemplary peripheral solder pads are possible too.

Moreover, and as detailed further below, the herein exemplarily described casing or packaging for a fiber optic transceiver allows to optimize the manufacturing process of assembling a surface mounted fiber optic transceiver and/or the manufacturing process of assembling a surface mounted fiber optic connector comprising a surface mounted fiber optic transceiver that is housed in a herein exemplarily described casing or packaging, respectively.

Said exemplary one or more solder pads which can be arranged substantially in or around the center the bottom surface of the casing may cover the majority, e.g. at least 50%, of the bottom surface area of the casing, thereby, in particular, further improving the thermal coupling between integrated circuits of the fiber optic transceiver inside the casing and a metal ground layer of a printed circuit board.

The top surface of the casing or packaging for a fiber optic transceiver can comprise at least one optical transparent opening configured for accommodating at least a part of at least one optical path for transmitting and/or receiving optical signals.

The exemplary at least one optical transparent opening can be configured to receive at least one optical coupling element, e.g. a lens or a fiber optic connection block, for coupling the optical signals into the at least one optical path.

This can inter alia facilitate, simplify and optimize the assembly of the fiber optic transceiver for use in a fiber optic connector since, for example, the optical coupling element may be mounted to the casing or packaging of the fiber optic transceiver separately after the casing or packaging of the fiber optic transceiver has been mounted and/or soldered to a printed circuit board.

This way it can, for example, inter alia be avoided that the rather sensitive optical coupling element is damaged or degraded or contaminated during a soldering process and/or during a mounting process of the casing or packaging of the fiber optic transceiver to the surface of a printed circuit board.

For example, it can be avoided that the optical coupling element is exposed to the high temperatures, e.g. in excess of 200° C., of reflow soldering heat and solder fumes or vapors that may deposit on the coupling element and that my damage and degrade the optical coupling element.

Furthermore, it can be avoided that the optical coupling element experiences undesired mechanical stress during the mounting of the casing or packaging of the fiber optic transceiver to the surface of a printed circuit board.

By allowing the optical coupling element to be inserted/mounted to the casing or packaging of the fiber optic transceiver after the casing or packaging has been soldered and/or mounted to a surface of a printed circuit board the optical coupling element posed no restrictions on methods, means and materials used for the assembly of the fiber optic transceiver for use in a fiber optic connector, in particular regarding the mounting of the casing or packaging of the fiber optic transceiver to the surface of a printed circuit board, thereby facilitating the assembly procedure for a fiber optic transceiver and/or fiber optic connector, respectively.

It is thereby also possible that the optical coupling element is pre-assembled into a part of a/the fiber optic connector and/or pre-mounted in a fiber optic connection block and is mounted to the casing or packaging of the fiber optic transceiver together with a/the part of the fiber optic connector to further facilitate the assembly of the fiber optic connector and to enable a simple two-step assembly of the fiber optic connector, wherein the first step may comprise placing and soldering the casing or packaging of the fiber optic transceiver with the fiber optic transceiver onto the surface of a printed circuit board, and wherein in a following second step the optical coupling element together with the fiber optic connector or fiber optic connector parts is mounted to/onto the casing or packaging of the fiber optic transceiver.

In particular, the herein exemplarily described casing or packaging for a fiber optic transceiver may comprise two optical transparent openings, e.g. a first optical transparent opening and a second optical transparent opening, wherein the first optical transparent opening can be configured to receive a first optical coupling element, e.g. a first lens or a first fiber optic connection block, and wherein the second optical transparent opening can be configured to receive a second optical coupling element, e.g. a second lens or a second fiber optic connection block.

In this exemplary configuration, an/the exemplary first optical coupling element can be configured for coupling optical signals into an optical path for transmitting optical signals from a fiber optic transceiver housed by the casing and an/the exemplary second optical coupling element can be configured for coupling optical signals into an optical path for receiving optical signals by a fiber optic transceiver housed by the casing.

In other words the herein exemplarily described casing or packaging for a fiber optic transceiver can provide at least two separate channels for optical signal communications, i.e. one channel for receiving optical light signals and one channel for transmitting optical light signals.

The herein exemplarily described at least one optical coupling element that can be mounted/inserted in said exemplary optical transparent opening(s) of the exemplary casing or packaging for housing a fiber optic transceiver may comprise at least one reflective surface, e.g. a reflective coating and/or a mirror, and wherein the possible exemplary at least one reflective surface of the at least one optical coupling element can be configured to provide collimation for emitted and/or received light and/or wherein the at least one optical coupling element can be configured to provide total internal reflection for emitted and/or received light, i.e. can be configured to provide total internal reflection for emitted and/or received optical signals [[ ]].

The exemplary at least one optical coupling element may comprise a lens, wherein an exemplary shape of the lens can be one of the following types: spherical, aspherical, bi-conical, or freeform.

For example, in particular the shape of the surface(s) of the at least one optical coupling element, e.g. a/said exemplary lens, that face the fiber optic transceiver and/or that face a fiber can have a shape according to one of the following types: spherical, aspherical, bi-conical, or freeform.

The exemplary surfaces of the optical coupling element, in particular the surface(s) of the optical coupling element and/or a/the lens (being a part of the optical coupling element) may have the above specific shapes (e.g. spherical, aspherical, bi-conical or freeform) to maintain minimal optical power loss while shaping the required modal power distribution of the optical system.

Additionally, a function of the surface shapes of the optical coupling element and/or the surface shapes of the exemplary lens and/or the surface shapes of surfaces of the fiber optic connection block can be to control (shape) the modal power distribution of the light to be fed into in a/the fiber of a/the optical data link/optical signal path in case the modal power distribution from a/the semiconductor light source (in the fiber optic transceiver) does not meet the requirements for the data link/optical signal path.

As indicated above, a fiber optic transceiver, e.g. a fiber optic transceiver for use in a fiber optic connector, for example, for being used in an optical communication system, can be housed in/accommodate by a herein described casing or packaging comprising one, some or all of the above and herein described features.

For example, an exemplary fiber optic transceiver may comprise at least one exemplary optical coupling element mounted to at least one exemplary optical transparent opening in the top surface of the herein described exemplary casing or packaging of a/the fiber optic transceiver.

Furthermore, an exemplary fiber optic transceiver may further comprise exemplary waveguide extensions coupled to the exemplary at least one optical coupling element.

In other words, an exemplary fiber optic transceiver as described above and herein may comprise a means for connecting the fiber optic transceiver to one or more further optoelectronic component for optical signal communication.

As indicated above, the exemplary at least one optical coupling element may comprise reflective surfaces, e.g. a lens that may comprise a reflective surface, for deflecting optical light signals into a predetermined orientation, e.g. a required fiber orientation.

For example, an/the exemplary reflective surface of the at least one optical coupling element, e.g. a reflective surface of a lens of the optical coupling element can be configured to adapt a/the light path or optical path from being perpendicular or substantially perpendicular to the surface of a printed circuit board to being parallel or substantially parallel to the surface of a/the printed circuit board, i.e. the least one optical coupling element may realize a deflection angle of about 90°. However, other deflection angles, e.g. in the range of 0° to 100, may be realized as well.

As also previously indicated, a/the reflective surface the optical coupling element, e.g. a/the reflective surface of a lens of the optical coupling element may be configured and shaped, e.g. curved, to provide internal reflection at a refractive index boundary, e.g. from lens material to air, to re-collimate diverging light from a source, e.g. a/the light-emitting diode of the fiber optic transceiver or light from a fiber arriving at the fiber optic transceiver, to a/the sink, e.g. a fiber leading to other optoelectronic components or a photo-detector of the fiber optic transceiver.

In other words, the optical coupling element, e.g. a lens/the lenses of the optical coupling element can control the modal power distribution of the light injection into an optical medium.

Furthermore, the optical coupling elements, e.g. the lens/the lenses of the optical coupling elements, can be designed independently optimized for the receiving optical light path and the transmitting optical light path of the fiber optic transceiver housed by the herein described casing of packaging.

The optical coupling elements, e.g. the lens/the lenses of the optical coupling elements, may further comprise means for alignment for ferrule mating with integrated circuits of the fiber optic transceiver and/or may comprise means, e.g. clamps, for maintaining the optical coupling elements in place inside/on the casing of the fiber optic transceiver and/or inside the housing of a fiber connector.

As previously indicated, the optical coupling elements, e.g. the lens/the lenses of the optical coupling elements, may further comprise exemplary waveguide extensions to facilitate meeting additional mechanical requirements, such as, for example, ensuring a predetermined minimum gap between a face/surface of an optical fiber connecting to the fiber optic transceiver, i.e. coupled by optical coupling element, and a/the optical transparent opening of the lid, i.e. the top surface, of the herein exemplary described casing or packaging of the fiber optic transceiver.

An exemplary assembly according to the present—disclosure may for example comprise:
a fiber optic connector comprising a fiber optic transceiver as described above and herein, and wherein the fiber optic transceiver can be housed in a casing or packaging as described above and herein,
a housing of the fiber optic connector, and
a printed circuit board onto which the fiber optic connector can be surface mounted.

Therein, the exemplary housing of the fiber optic connector may comprise one or more preassembled optical coupling elements, e.g. a lens and/or a fiber optic connection block.

An exemplary method for assembling a surface mounted fiber optic connector may comprise one, some or all of the following steps:
surface mounting a fiber optic transceiver housed in casing or packaging for a fiber optic transceiver as described above and herein, wherein said surface mounting of the fiber optic transceiver may comprise surface mounting the casing or packaging to a printed circuit board by soldering, e.g. by reflow-soldering, such that the one or more solder pads of the bottom surface of the casing establish an electrical connection with the printed circuit board,
after mounting the casing or packaging of the fiber optic transceiver to the printed circuit board, mounting any further remaining components of the fiber optic connector, e.g. a housing of the fiber optic connector, to the casing or packaging of the fiber optic transceiver and/or to the printed circuit board.

Therein the exemplary step of mounting any further remaining components of the fiber optic connector may inter alia comprise mounting a housing of the fiber optic connector to the casing or packaging of the fiber optic transceiver, wherein the housing of the fiber optic connector may comprise one or more pre-assembled optical coupling elements, e.g. a lens and/or fiber optic connection block, wherein said one or more pre-assembled optical coupling elements are received by exemplary one or more optical transparent openings, as described above and herein, in the casing or packaging of the fiber optic transceiver.

However, it is also possible that after mounting the casing or packaging of the fiber optic transceiver to the printed circuit board instead of using pre-assembled optical coupling elements that are part of the housing of the fiber optic connector, one or more optical coupling elements, e.g. a lens and/or a fiber optic connection block, may be separately mounted to the fiber optic transceiver, e.g. via the exemplary one or more optical transparent openings in the top surface of the casing or packaging of the fiber optic transceiver, as described above and herein.

In any case the herein described exemplary coupling elements, e.g. a lens and/or fiber optic connection block, can mate with a/the corresponding optical transparent opening in the casing or packaging of the fiber optic transceiver. To facilitate this mating, the exemplary coupling elements may comprise mechanical means for alignment, e.g. pins or elastic elements, at the bottom surface of the coupling element that faces the optical transparent opening in the top surface of the casing or packaging of the fiber optic transceiver.

To further minimize any risk of damaging or degrading the exemplary optical coupling elements, e.g. lenses and/or fiber optic connection blocks, the step of mounting any further remaining components of the fiber optic connector after the casing or packaging of the fiber optic transceiver to a printed circuit board by soldering may comprise waiting for predetermined cool down time to allow the sufficient cooling down of components heated by the soldering process to avoid damages to optical coupling elements or other components of the fiber optic connector to be mounted to the casing or packaging of the fiber optic transceiver.

An exemplary predetermined cool down time may range from seconds to minutes or longer. Said exemplary predetermined cool down time can be used for quality checks, e.g. visual or X-ray inspections and/or electrical checks, of the mounting of the casing or packaging of the fiber optic transceiver to the printed circuit board, for example, to check if the solder pads of the casing or packaging have been soldered to the printed circuit board with an appropriate quality.

DETAILED DESCRIPTION

Figure 1B:
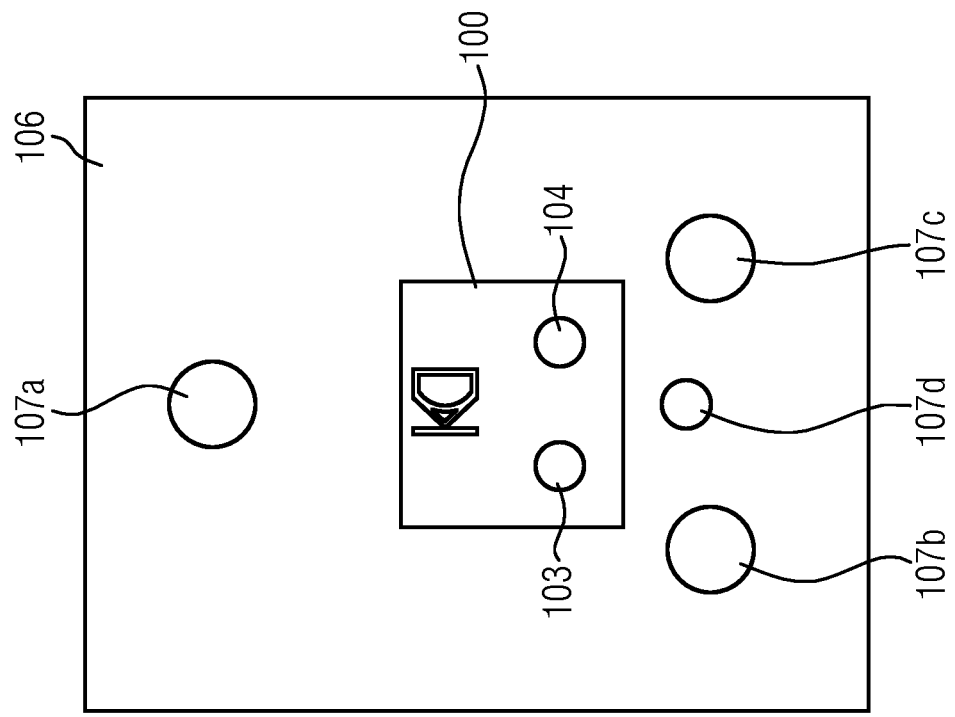
FIG. 1b: Exemplary casing or packaging for housing a fiber optic transceiver surface mounted on a printed circuit board.
Figure 1A:
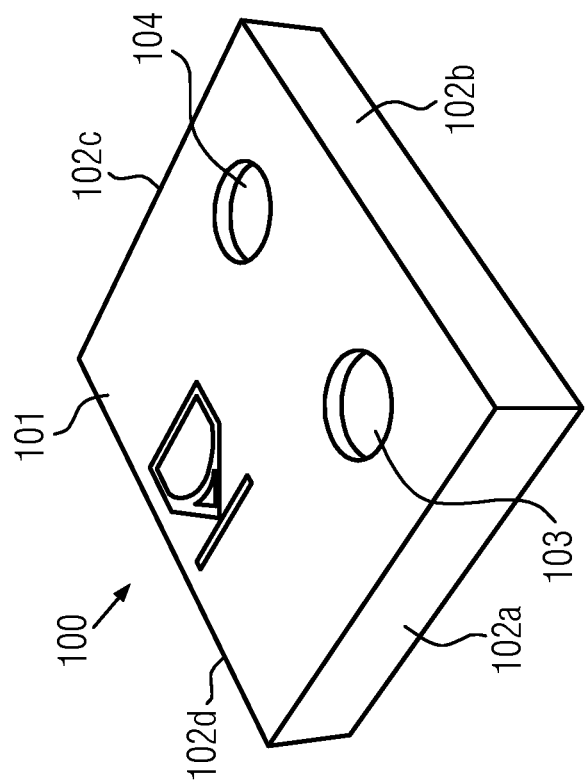
FIG. 1a: Exemplary casing or packaging for housing a fiber optic transceiver.

FIG. 1a exemplary shows a possible casing 100 or packaging for housing a fiber optic transceiver (not shown) with exemplary features as described above. The exemplary shown casing or packaging 100 is box-shaped or cuboid-shaped and comprises a top surface 101, four lateral surfaces 102a, 102b, 102c, 102d and a bottom surface 105.

However, it is to be noted that other shapes of the casing 100 with different shapes of the top and bottom surfaces and lateral sides and surfaces are conceivable too, e.g. a cylinder shape or general convex polytope shapes.

Further shown are two exemplary optical transparent openings 103 and 104 in the top surface 101 of the casing 100 and that are suitable for receiving and accommodating at least a part of at least one optical path for transmitting and/or receiving optical signals, and wherein the exemplary optical transparent openings are configured to receive at least one optical coupling element (not shown), e.g. a lens or a fiber optic connection block, for coupling the optical signals into a/the at least one optical path.

For example, the optical transparent opening 103 may serve as a transmitting channel for accommodating an optical coupling element configured for coupling optical signals into an optical path for transmitting optical signals from a/the fiber optic transceiver housed by the casing 100 to other optoelectronic components (not shown) and the optical transparent opening 104 may serve as a receiving channel for accommodating an optical coupling element configured for coupling optical signals, e.g. from other optoelectronic components (not shown), into an optical path for receiving optical signals by a fiber optic transceiver housed by the casing 100.

FIG. 1b exemplary shows the casing or packaging 100 for housing a fiber optic transceiver from FIG. 1a being surface mounted on the surface of printed circuit board 106.

For completeness, it is noted that for better visibility, the scale of FIG. 1a and the scale of FIG. 1b are not the same.

Further shown are exemplary holes or openings 107a, 107b, 107c, 107d in the printed circuit board 106 that can be used for mounting, securing and retaining the housing of a fiber connector (not shown) to be mounted onto the casing or packaging 100 housing a fiber optic transceiver.

Figure 2C:
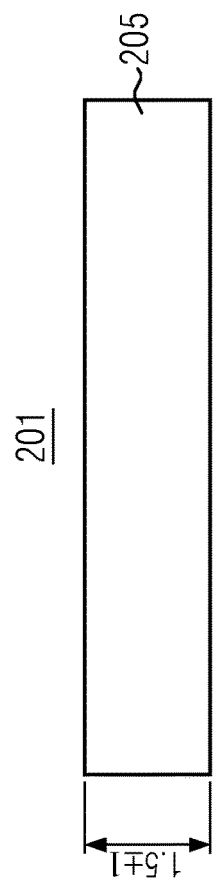
FIG. 2c: Exemplary schematic view of exemplary lateral surface of casing or packaging for housing a fiber optic transceiver.
Figure 2B:
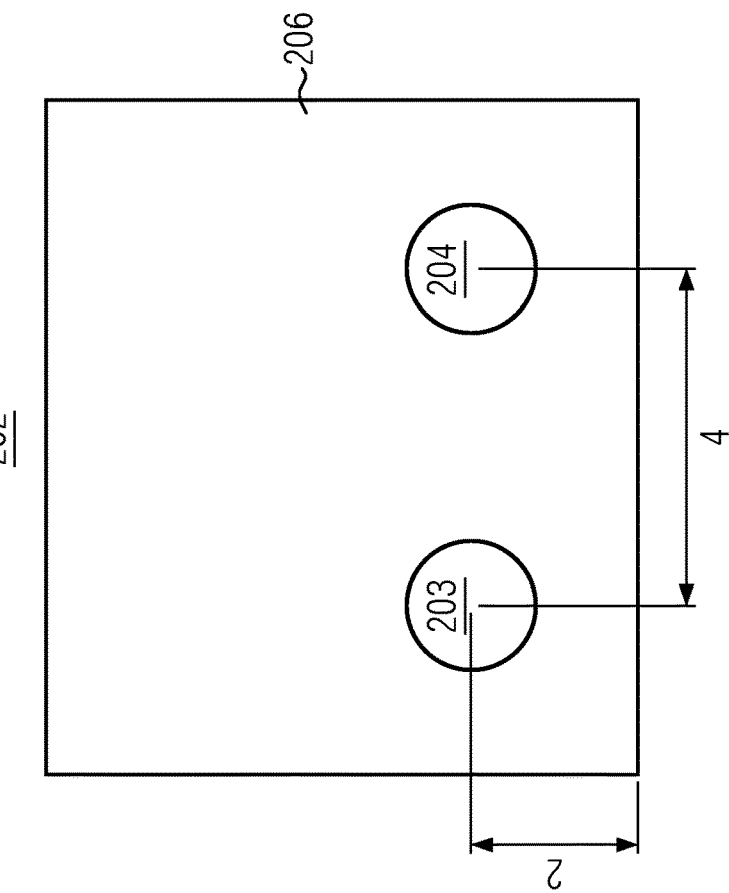
FIG. 2b: Exemplary schematic view of exemplary top surface of casing or packaging for housing a fiber optic transceiver.
Figure 2A:
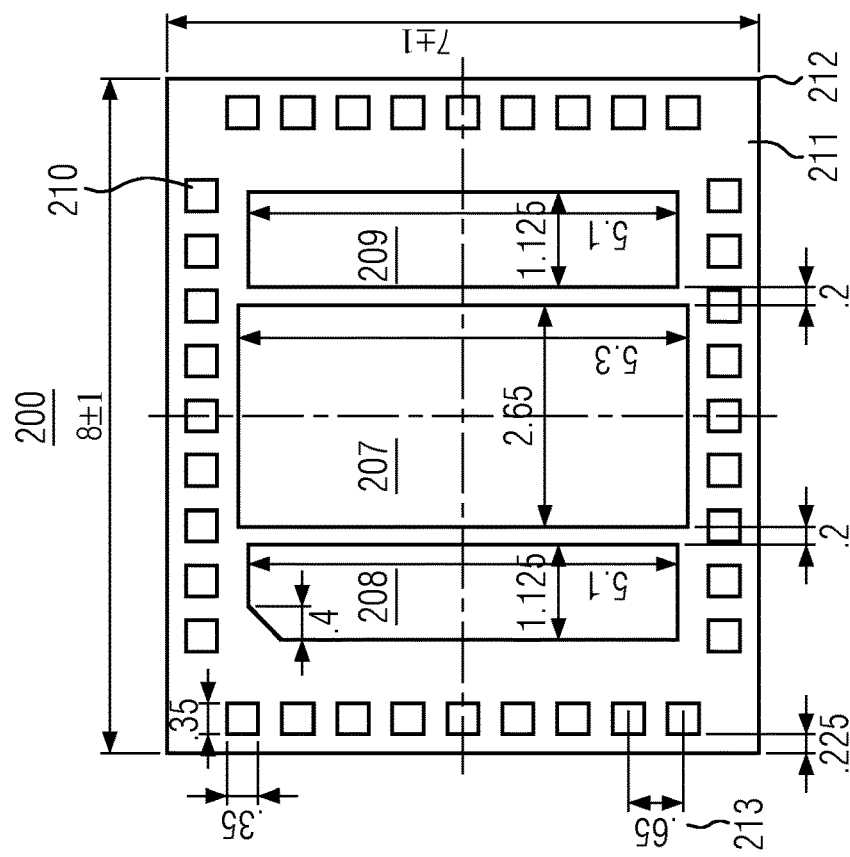
FIG. 2a: Exemplary schematic view of exemplary bottom surface of casing or packaging for housing a fiber optic transceiver.

FIG. 2a, FIG. 2b and FIG. 2c exemplary show a bottom view 200, i.e. an exemplary bottom surface 211, an exemplary side view 201, i.e. an exemplary lateral surface 205, and an exemplary top view 202, i.e. an exemplary top surface 206, of an exemplary casing or packaging for housing a fiber optic transceiver (not shown) analog or identical to the casing 100 illustrated in FIG. 1a and FIG. 1b.

The exemplary bottom view 200 exemplary shows a plurality of solder pads 207, 208, 209, 210, with solder pads 207, 208, 209 exemplarily being arranged substantially in and around the center of the bottom surface 211 of the casing and with a plurality of solder pads 210 arranged substantially along or close to the perimeter or edge 212 of the bottom surface 211 of the casing.

The shape of the solder pads 207, 208, 209, 210 is substantially rectangular or squared but other shapes, e.g. round shapes, are possible too.

The number of solder pads shown, e.g. with 9 solder pads 210 at each of the four sides along the perimeter of the bottom surface 211, as well as the three solder pads 207, 209, 210 arranged in and around the center of the bottom surface 211 is merely exemplary.

While in the present shown example, the most central solder pad 207 is the largest of the centrally arranged solder pads 207, 208, 209, this is just optional and it is, for example, inter alia also conceivable, that the centrally arranged solder pads 207, 208, 209 are of the same size and shape or all of different sizes and shapes.

The dimensions and distances marked by arrows and figures are also merely exemplary. While the illustrated and annotated dimensions can, for example, be interpreted as being in mm, other dimensions are conceivable too.

While the arrangement of the solder pads 210 arranged substantially along or close to the perimeter or edge 212 of the bottom surface 211 of the casing can be regular, e.g. with a regular pitch 213, e.g. 0.65 mm, for the distance of adjacent pads on a given side, other nonregular arrangements of the solder pads 210 are possible too.

One, some or all of the exemplary solder pads 207, 208, 209 in and/or around the center of the bottom surface 211 can thereby be configured to be connected to ground potential, e.g. a ground potential of a printed circuit board (not shown).

Said exemplary solder pads 207, 208, 209 further can provide thermal coupling to the printed circuit board ground plane for heat dissipation as well as low inductance electrical connection for optimal power and signal integrity in high performance optical communication applications.

At least one, some or all of the solder pads 210 arranged substantially along or close to the perimeter of the bottom surface 211 can be configured to provide an electrical connection between components of a fiber optic transceiver (not shown) housed in the casing and integrated circuit components of a printed circuit board (not shown) onto which the casing can be mounted.

FIG. 2b shows an exemplary top view 202 of the top surface 206 of a casing or packaging for housing a fiber optic transceiver analog or identical to the casing 100 illustrated in FIG. 1a and FIG. 1b and wherein two exemplary optical transparent openings 203, 204 are shown in said top surface 206.

As exemplary described above, the optical transparent openings 203, 204 can suitable/configured for receiving and accommodating at least a part of at least one optical path for transmitting and/or receiving optical signals, and wherein the exemplary optical transparent openings are configured to receive at least one optical coupling element (not shown), e.g. a lens or a fiber optic connection block, for coupling the optical signals into a/the at least one optical path, e.g. an optical path for transmitting optical signals from a/the fiber optic transceiver and/or an optical path for receiving optical signals by a/the fiber optic transceiver housed by the casing.

FIG. 2c shows an exemplary side view 201, i.e. an exemplary lateral surface 205 of a casing or packaging for housing a fiber optic transceiver analog or identical to the casing or packaging 100 illustrated in FIG. 1a and FIG. 1b.

Figure 3B:
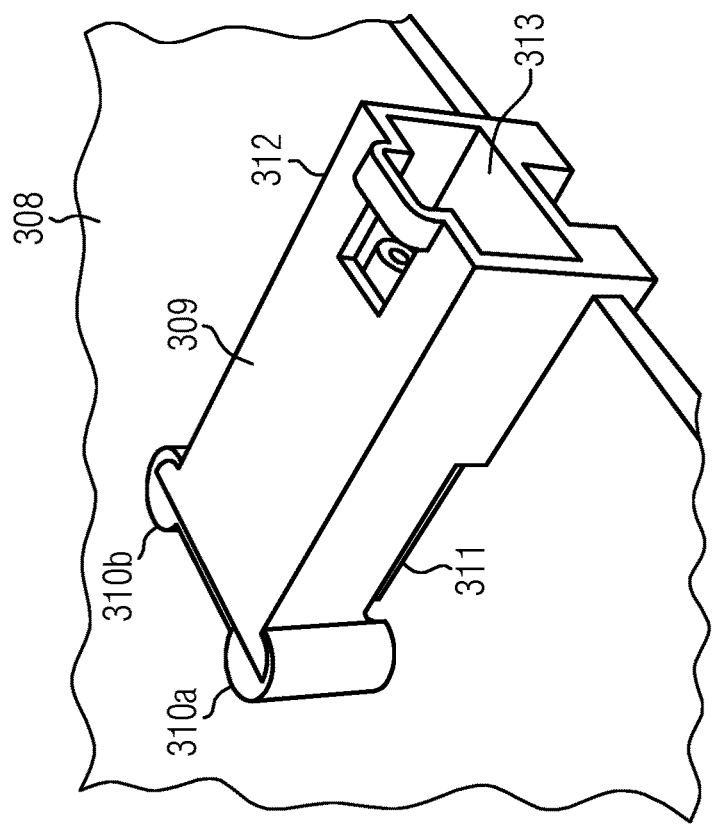
FIG. 3b: Exemplary fiber optic connector comprising exemplary fiber optic transceiver housed in exemplary casing or packaging.
Figure 3A:
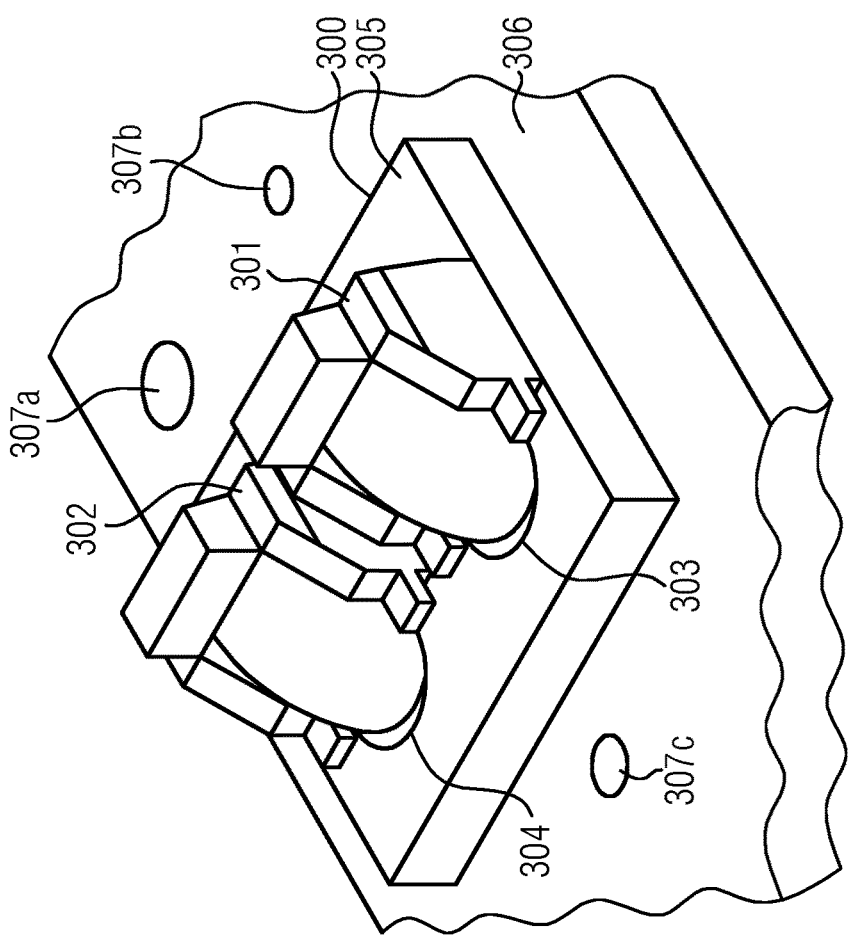
FIG. 3a: Exemplary casing or packaging for housing a fiber optic transceiver with exemplary optical coupling elements.

FIG. 3a shows an example of a casing 300 or packaging for housing a fiber optic transceiver, said casing 300 being analog or identical to the casing 100 depicted in FIG. 1a and FIG. 1b, with two exemplary optical coupling elements 301, 302, e.g. comprising rectangular lenses, mounted in the optical transparent openings 303, 304 of the top surface 305 of exemplary casing 300. The optical coupling elements 301, 302 may optionally comprise retaining and fixation means to maintain them in place in the optical transparent openings.

Furthermore, an exemplary printed circuit board 306 is shown, onto which the exemplary casing or packaging 300 for the fiber optic transceiver is mounted and wherein the printed circuit board 306 comprises holes or openings 307a, 307b, 307c that can be used to mount and/or retain parts of a fiber connector (not shown), in particular parts of the housing of a fiber connector, that is to be mounted onto/on top of the exemplary casing or packaging 300 for the fiber optic transceiver and its optical coupling elements 301, 302.

FIG. 3b exemplary shows an assembled fiber connector 309 wherein the housing 312 of the fiber optic connector 309 is mounted onto a/the casing or packaging 311 for a fiber optic transceiver and its optical coupling elements (not shown), wherein said casing 311 may be analog or identical to the casings 300 or 100 depicted in FIG. 3a and FIG. 1a or FIG. 1b.

In the shown example, the fiber optic connector 309 or the housing 312 of the fiber optic connector 309, respectively, is mounted and retained on the printed circuit board 308 via exemplary pins 310a, 310b that are mounted into/received by holes or openings in the printed circuit board 308.

The exemplary fiber optic connector 309 exemplary comprises a connection/connection port 313 that can establish a connection, e.g. a bi-directional connection, to an exemplary receiving optical communication path and/or to an exemplary transmitting optical communication path of the fiber optic transceiver (not shown) housed by casing 311.

It is further conceivable that a fiber optic connector can comprise further connections/connection ports, e.g. two connection ports, and that a fiber optic connector can house multiple fiber optic transceivers that are each accommodated in a casing or packaging as exemplary described herein and wherein, for example, a first connection port can be connected to a first casing or packaging of a first fiber optic transceiver and a second connection port can be connected to a second casing or packaging of a second fiber optic transceiver. In other words, the number of fiber optic transceivers and ports that can be housed in a fiber connector housing can be easily scaled up.

FIG. 3b is an example for an edge board connector, wherein the fiber optic connector is mounted at the edge of a printed circuit board. However, the fiber optic connector could also implemented as a board center connector, wherein the fiber optic connector is mounted at the center of a printed circuit board or at a distance from the edge of a/the printed circuit board.

The reference numerals identify the following components:
100 Exemplary casing or packaging for housing a fiber optic transceiver
101 Exemplary top surface of casing
102a, 102b, 102c, 102d Exemplary lateral surfaces/later sides of casing
103 Exemplary (first) optical transparent opening
104 Exemplary (second) optical transparent opening
105 Exemplary bottom surface of casing
106 Exemplary printed circuit board
107a, 107b, 107c, 107d Exemplary holes or openings in printed circuit board
200 Exemplary bottom view of exemplary casing or packaging for housing a fiber optic transceiver
201 Exemplary side view of exemplary casing or packaging for housing a fiber optic transceiver
202 Exemplary top view of exemplary casing or packaging for housing a fiber optic transceiver
203 Exemplary (first) optical transparent opening
204 Exemplary (second) optical transparent opening
205 Exemplary lateral surface/side surface of exemplary casing or packaging for housing a fiber optic transceiver
206 Exemplary top surface of exemplary casing or packaging for housing a fiber optic transceiver
207 Exemplary solder pad, exemplary (first) central solder pad
208 Exemplary solder pad, exemplary (second) central solder pad
209 Exemplary solder pad, exemplary (third) central solder pad
210 Exemplary solder pad, exemplary peripheral solder pad arranged substantially along or close to the perimeter of the bottom surface of the casing
211 Exemplary bottom surface of the casing
212 Exemplary edge or perimeter of the bottom surface of the casing
213 Exemplary pitch, exemplary distance of adjacent solder pads arranged substantially along or close to the perimeter of the bottom surface of the casing
300 Exemplary casing or packaging for housing a fiber optic transceiver
301 Exemplary (first) optical coupling element, exemplary lens, exemplary rectangular lens, exemplary fiber optic connection block
302 Exemplary (second) optical coupling element, exemplary lens, exemplary rectangular lens, exemplary fiber optic connection block
303 Exemplary (first) optical transparent opening
304 Exemplary (second) optical transparent opening
305 Exemplary top surface of exemplary casing or packaging for housing a fiber optic transceiver
306 Exemplary printed circuit board
307a, 307b, 307c Exemplary holes or openings in printed circuit board
308 Exemplary (alternative) printed circuit board
309 Exemplary fiber optic connector
310a, 310b Exemplary pins for mounting the fiber optic connector/the housing of the fiber optic connector to the printed circuit boards via the holes or openings of the printed circuit board
311 Exemplary casing or packaging for housing a fiber optic transceiver
312 Exemplary housing of fiber optic connector
313 Exemplary (first) connection/port of fiber optic connector

The invention claimed is:

1. A casing for housing a fiber optic transceiver for use in a fiber optic connector, the casing comprising a top surface, a bottom surface and lateral surfaces, wherein the top surface and all lateral surfaces are at least in parts electrically conductive, and wherein the bottom surface of the casing comprises one or more solder pads with flat and planar contact surfaces arranged substantially in the center of the bottom surface of the casing, and wherein the top surface comprises at least one optical transparent opening configured for accommodating at least a part of at least one optical path for transmitting and/or receiving optical signals.

2. The casing according to claim 1, further comprising one or more solder pads arranged substantially along or close to the perimeter of the bottom surface of the casing.

3. The casing according to claim 2, wherein at least one of the one or more solder pads arranged substantially in the center of the bottom surface is/are configured to be connected to ground potential, and/or wherein at least one of the one or more solder pads arranged substantially along or close to the perimeter of the bottom surface is/are configured to provide an electrical connection between components of the fiber optic transceiver housed in the casing and integrated circuit components of a printed circuit board onto which the casing can be mounted.

4. The casing according to claim 1, wherein the one or more solder pads arranged substantially in the center of the bottom surface of the casing cover the majority of the bottom surface area of the casing and/or wherein the casing comprises metal and/or conductive polymer materials.

5. The casing according to claim 1, wherein the at least one optical transparent opening is configured to receive at least one optical coupling element for coupling the optical signals into a/the at least one optical path.

6. The casing according to claim 1, comprising a first optical transparent opening and a second optical transparent opening, wherein the first optical transparent opening is configured to receive a first optical coupling element, and the second optical transparent opening is configured to receive a second optical coupling element, and wherein the first optical coupling element is configured for coupling optical signals into an optical path for transmitting optical signals from the fiber optic transceiver housed by the casing and wherein the second optical coupling element is configured for coupling optical signals into an optical path for receiving optical signals by the fiber optic transceiver housed by the casing.

7. The casing according to claim 5, wherein the at least one optical coupling element comprises at least one reflective surface, and wherein the at least one reflective surface of the at least one optical coupling element is configured to provide collimation for emitted and/or received light and/or wherein the at least one optical coupling element is configured to provide total internal reflection for emitted and/or received light.

8. The casing according to claim 5, wherein the at least one optical coupling element comprises a lens, and wherein the shape of the lens is selected from the group consisting of: spherical, aspherical, bi-conical, and freeform.

9. The casing according to claim 8, wherein surfaces of the at least one optical coupling element that face the fiber optic transceiver and/or that face a fiber have a shape selected from the group consisting of: spherical, aspherical, bi-conical, and freeform.

10. A fiber optic transceiver housed in the casing according to claim 1.

11. The fiber optic transceiver according to claim 1, comprising at least one optical coupling element mounted to the at least one optical transparent opening in the top surface of the casing of the fiber optic transceiver.

12. The fiber optic transceiver according to claim 5, wherein the at least one optical coupling element comprises a lens comprising a reflective surface for deflecting optical light signals into a predetermined orientation.

13. An assembly comprising a fiber optic connector comprising a fiber optic transceiver housed in a casing according to claim 1, a housing of the fiber optic connector, and a printed circuit board onto which the fiber optic connector can be surface mounted.

14. A method for assembling a surface mounted fiber optic connector comprising:
surface mounting the fiber optic transceiver housed in a casing for housing the fiber optic transceiver for use in the fiber optic connector, the casing comprising a top surface, a bottom surface and lateral surfaces, wherein the top surface and all lateral surfaces are at least in parts electrically conductive, and wherein the bottom surface of the casing comprises one or more solder pads with flat and planar contact surfaces arranged substantially in the center of the bottom surface of the casing, and wherein the top surface comprises at least one optical transparent opening configured for accommodating at least a part of at least one optical path for transmitting and/or receiving optical signals, said surface mounting of the fiber optic transceiver comprising surface mounting the casing to a printed circuit board by soldering such that the one or more solder pads of the bottom surface of the casing establish an electrical connection with the printed circuit board,
after mounting the casing to the printed circuit board, mounting any further remaining components of the fiber optic connector to the casing of the fiber optic transceiver and/or to the printed circuit board.

15. The method according to claim 14, wherein mounting any further remaining components of the fiber optic connector comprises mounting a housing of the fiber optic connector to the casing, wherein the housing of the fiber optic connector comprises one or more pre-assembled optical coupling elements.

16. The casing according to claim 3, wherein the at least one of the solder pads is/are configured to be connected to the ground potential of a printed circuit board.

17. The casing according to claim 4, wherein said one or more solder pads cover at least 50% of the bottom surface area of the casing.

18. The casing according to claim 5, wherein the at least one optical coupling element includes a lens or a fiber optic connection block.

19. The casing according to claim 6, wherein the first optical coupling element includes a first lens or a first fiber optic connection block, and wherein the second optical coupling element includes a second lens or a second fiber optic connection block.

20. The casing according to claim 7, wherein the at least one reflective surface includes a reflective coating.

* * * * *